(12) United States Patent
Shieh et al.

(10) Patent No.: US 9,798,481 B1
(45) Date of Patent: Oct. 24, 2017

(54) MEMORY SYSTEM INCLUDES A MEMORY CONTROLLER COUPLED TO A NON-VOLATILE MEMORY ARRAY CONFIGURED TO PROVIDE SPECIAL WRITE OPERATION TO WRITE DATA IN THE NON-VOLATILE MEMORY ARRAY BEFORE A BOARD MOUNT OPERATION IS APPLIED AND PROVDE A REGULAR WRITE OPERATION AFTER A BOARD MOUNT OPERATION IS APPLIED

(71) Applicant: Winbond Electronics Corp., Taichung (TW)

(72) Inventors: Ming-Huei Shieh, Taichung (TW); Chuen-Der Lien, Taichung (TW); Chi-Shun Lin, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/182,612

(22) Filed: Jun. 15, 2016

(51) Int. Cl.
    *G11C 11/00*     (2006.01)
    *G06F 3/06*     (2006.01)

(52) U.S. Cl.
    CPC .......... *G06F 3/0619* (2013.01); *G06F 3/061* (2013.01); *G06F 3/0659* (2013.01); *G06F 3/0688* (2013.01)

(58) Field of Classification Search
    CPC ...... G06F 3/0619; G06F 3/061; G06F 3/0659; G06F 3/0688
    USPC .............................. 365/163, 189.03, 201, 52
    See application file for complete search history.

(56) References Cited

U.S. PATENT DOCUMENTS

| 4,809,231 | A | * | 2/1989 | Shannon | .......... G11C 29/50004 365/201 |
| 5,602,738 | A | * | 2/1997 | Sasaki | ...................... F02D 37/02 365/189.03 |
| 2014/0233299 | A1 | | 8/2014 | Lan et al. | |
| 2016/0004470 | A1 | * | 1/2016 | Cho | ....................... G06F 3/0617 711/103 |
| 2017/0060463 | A1 | * | 3/2017 | Shim | ..................... G06F 3/0625 |

FOREIGN PATENT DOCUMENTS

| CN | 101577309 | 5/2014 |
| TW | I446352 | 7/2014 |

\* cited by examiner

*Primary Examiner* — Connie Yoha
(74) *Attorney, Agent, or Firm* — Jianq Chyun IP Office

(57) ABSTRACT

A memory system and operating method thereof are provided. The non-volatile memory array is configured to store data. The controller is coupled to the non-volatile memory array. The memory controller is configured to provide a special write operation to write the data in the non-volatile memory array before a board mount operation is applied, and provide a regular write operation to write the data in the non-volatile memory array after the board mount operation is applied. A read margin provided by the special write operation is larger than a read margin provided by the regular write operation.

20 Claims, 4 Drawing Sheets

MEMORY SYSTEM INCLUDES A MEMORY CONTROLLER COUPLED TO A NON-VOLATILE MEMORY ARRAY CONFIGURED TO PROVIDE SPECIAL WRITE OPERATION TO WRITE DATA IN THE NON-VOLATILE MEMORY ARRAY BEFORE A BOARD MOUNT OPERATION IS APPLIED AND PROVDE A REGULAR WRITE OPERATION AFTER A BOARD MOUNT OPERATION IS APPLIED

BACKGROUND OF THE INVENTION

1. Field of the Invention

The invention generally relates to a memory system and an operating method thereof, in particular, to a memory system and an operating method thereof for detecting whether the memory system goes through a board mount operation.

2. Description of Related Art

A non-volatile memory has an advantage that data stored therein is not disappeared after being power off, so that it serves as a necessary memory element for maintaining a normal operation of many electronic products. Presently, the non-volatile memory is categorized into a plurality of types. A resistive random access memory (RRAM) is a kind of non-volatile memory positively developed in the industry, which has advantages of low write operation voltage, short write and erase time, long memory time, non-destructive reading, multi-state memory, simple structure and small occupation area, etc., and has a great application potential in personal computers and electronic equipment in the future.

However, there are still issues concerning the reliability of the non-volatile memory. One of the issues is a data retention error that occurs due to resistance drifting under high temperature, which causes data read from the non-volatile memory after a high temperature process is different from the original data stored in the non-volatile memory. Moreover, when the non-volatile memory is mounted or placed directly onto a surface of a printed circuit board (PCB) by surface mount technology (SMT), a solder reflow step based on a high temperature (260° C. for 30 seconds by 1 to 3 times, for example) is also required, which may severely cause the data loss issue. In current technology, it is hard to know whether a board mount operation with high temperature has been applied on the non-volatile memory.

SUMMARY OF THE INVENTION

Accordingly, the invention is directed to a memory system and an operating method thereof, which determine whether a board mount operation is applied on the memory system by executing a special write operation. Additionally, a good data retention characteristic of the memory system is also achieved.

The invention provides a memory system includes a non-volatile memory array and a memory controller. The non-volatile memory array is configured to store data. The controller is coupled to the non-volatile memory array. The memory controller is configured to provide a special write operation to write the data in the non-volatile memory array before a board mount operation is applied, and provide a regular write operation to write the data in the non-volatile memory array after the board mount operation is applied. A read margin provided by the special write operation is larger than a read margin provided by the regular write operation.

The invention further provides an operating method of a memory system. The method includes following steps. A special write operation is provided to write data in a non-volatile memory array of the memory system before a board mount operation is applied. A regular write operation is provided to write the data in the non-volatile memory array after the board mount operation is applied. A read margin provided by the special write operation is larger than a read margin provided by the regular write operation.

In view of the above, in the embodiments of the invention, the special write operation, e.g. the strong write operation, is executed for at least initializing the non-volatile memory array, such that whether the board mount operation is applied on the non-volatile memory array is determined by an enough number of the selected memory cells which switch their states. In addition, since the special write operation is executed before the board mount operation, the data retention is guaranteed.

Several exemplary embodiments accompanied with figures are described in detail below to further describe the invention in details.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
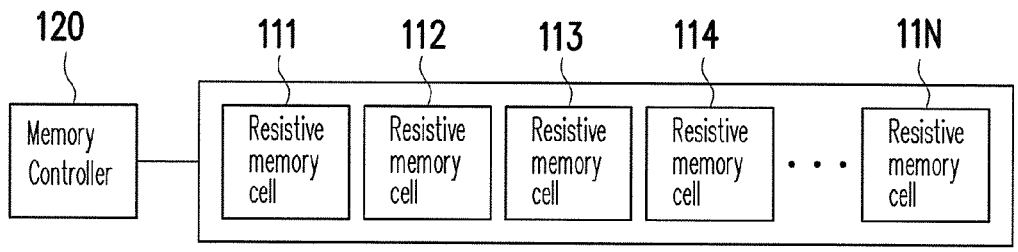
FIG. 1 illustrates a block diagram of a resistive memory system according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

In the following embodiments, a resistive memory is exemplarily disclosed for description of the memory system and the operating method thereof. Nevertheless, the invention is not intended to limit the type of the memory system. The memory system may include a phase change random write memory (PCRAM) or conductive-bridging random write memory (CBRAM). The operating method of the invention any be applied to any type of the memory systems listed above.

Referring to FIG. 1, FIG. 1 illustrates a block diagram of a resistive memory system according to an embodiment of the invention. The resistive memory system 100 includes a plurality of resistive memory cells 111~11N and a memory controller 120, where the memory controller 120 is coupled to the resistive memory cells 111~11N. In the present embodiment, at least parts of the resistive memory cells 111~11N (hereinafter refer to a plurality of selected resistive memory cells) may be used for indicating whether the board mount operation is applied on the resistive memory system 100.

Figure 2:
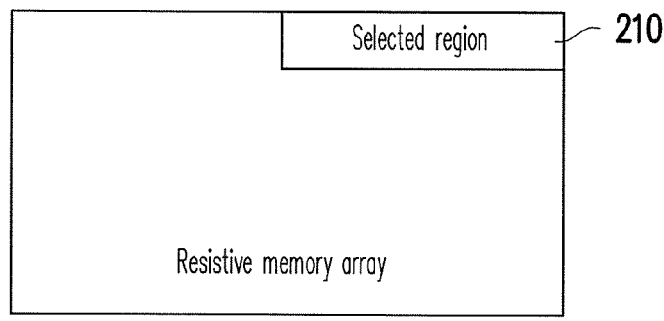
FIG. 2 illustrates a schematic diagram of an exemplary configuration of the resistive memory cells according to the embodiment of FIG. 1.

In the present embodiment, the selected resistive memory cells may be configured to an edge region adjacently. Referring to FIG. 2, FIG. 2 illustrates a schematic diagram of an exemplary configuration of the resistive memory cells according to the embodiment of FIG. 1. In the exemplary embodiment, a resistive memory array 200 includes the resistive memory cells 111~11N, where the resistive memory cells 111~11N may be arranged in an array and configured to store data. As shown in FIG. 2, a selected region 210 may be configured to a corner of the resistive memory array 200, where the selected region 210 may be arranged by the selected resistive memory cells. Nevertheless, the invention is not intended to limit the location of the selected region 210.

For convenient explanation, the resistive memory cells 111~114 are taken to be the selected resistive memory cells as example in the following description.

Specifically, before the board mount operation is applied, the memory controller 120 may execute a special write operation (hereinafter refer to a strong write operation) to set the resistive memory cells 111~114 into a first resistance state during a strong write time period. That is to say, the strong write operation is provided to write the data in the resistive memory cells 111~114 before the board mount operation is applied. In the present embodiment, the resistive memory array 200 may include a memory data array, an error-correcting code (ECC) array, or a redundancy array, and thus the strong write operation may be applied to the memory data array, the ECC array, the redundancy array or any configuration array. Then, the memory controller 120 may detect whether the selected resistive memory cells 111~114 switch to a second resistance state from the first resistance state according to the board mount operation applied on the resistive memory system 100. In the present embodiment, a regular write operation is provided to write the data in the resistive memory cells 111~114 after the board mount operation is applied.

It is noted here, the memory controller 120 enables the strong write time period before the board mount operation, so as to execute the strong write operation. In the present embodiment, the strong write operation is limited to a narrower temperature range and/or a narrower supply voltage range than a temperature range and/or a supply voltage range that the regular write operation is limited. For example, the strong write operation may be limited at a preferred temperature, e.g. 25° C., and/or at a preferred power supply range, e.g. 3.3V-3.6V. The preferred temperature and power supply range are disclosed for example, and the invention is not limited thereto. Furthermore, the first resistance state may be regarded as an initial state or reference data stored in the selected resistive memory cells 111~114. Since the selected resistive memory cells 111~114 may switch to the second resistance state due to high temperature resulted from the board mount operation, whether the board mount operation is applied on the resistive memory system 100 may be detected based on the aforementioned characteristic.

As for detailed applications of the strong write operation, briefly, the strong write operation may be executed by providing a greater power on the resistive memory system 100 than that required for executing the regular write operation. For instance, the memory controller 120 may apply at least one of a greater voltage, a greater current limit during the strong write time period. Furthermore, if the memory controller 120 executes the strong write operation in a form of voltage pulse, the strong write operation may be executed with a longer pulse width. In addition, relative more voltage pulses and different algorithms thereof may be applied.

In some embodiments, the strong write operation may be a heavy forming operation. As to the implementation details of the heavy forming operation, the operations for making the resistive memory cells to be soft breakdown known to people having ordinary skill in the pertinent art are applicable herein, and the invention is not limited thereto.

Figure 3:
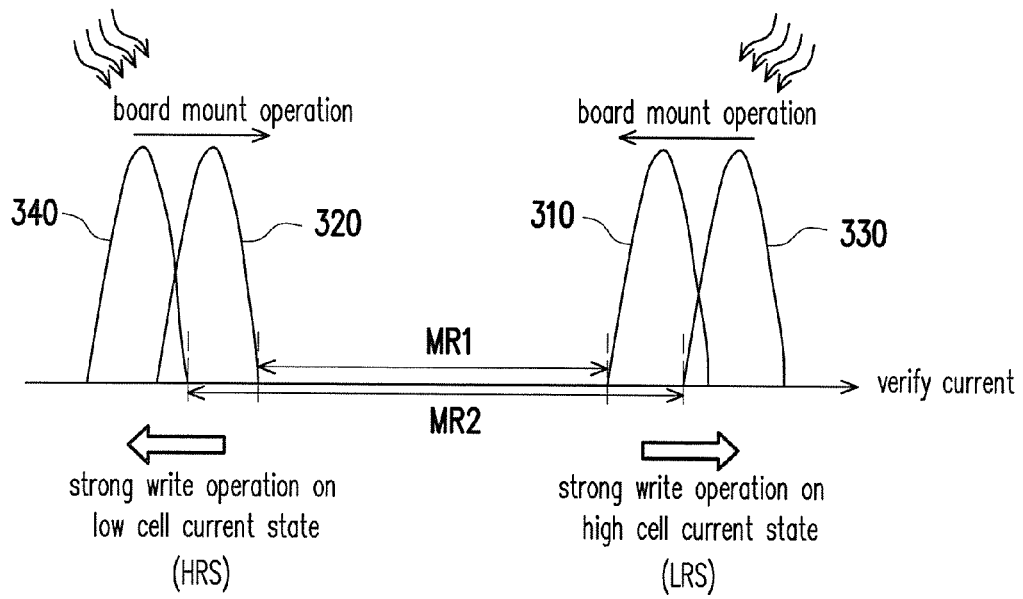
FIG. 3 illustrates a cell distribution diagram according to an embodiment of the invention.

In the present embodiment, the strong write operation is executed for widen a read margin of the resistive memory system 100. As such, based on the strong write operation applied before the board mount operation, a good data retention characteristic of the resistive memory system 100 may be achieved consequently. FIG. 3 illustrates a cell distribution diagram according to an embodiment of the invention. Referring to FIG. 3, the horizontal axis shows the verify current, and the vertical axis shows the cell count. After the strong write operation is applied, cell distributions 310 and 320 are respectively adjusted to cell distributions 330 and 340, and thus the read margin of the resistive memory system 100 increases from the read margin MR1 to the read margin MR2. The read margin MR2 provided by the strong write operation is larger than the read margin MR1 provided by the regular write operation in the present embodiment. After the board mount operation, e.g. a surface mount, is executed, the read margin of the resistive memory system 100 changes from the read margin MR2 to the read margin MR1. Accordingly, to solve data retention issue of the resistive memory system 100 after the board mount operation, e.g. a high temperature surface mount, the strong write operation is executed to enhance the read margin before the board mount operation. In the present embodiment, the strong write operation may be applied on both the first resistance state or/and the second resistance state to increase the read margin MR1 provided by the regular write operation to the read margin MR2 provided by the strong write operation. The increased read margin MR2 provides the immunity of data read failure after the board mount operation.

In the present embodiment, the first resistance state may be a low resistance state (LRS), and the second resistance state may be a high resistance state (HRS). It is noted that in terms of data retention, a resistive memory cell in the low resistance state may be easier to switch to the high resistance state in response to the high temperature of the board mount operation. In exemplary embodiments of the invention, the enhanced read margin MR2 provided by the strong write operation may applied on one of two write states, e.g. LRS or HRS, in a binary memory system, or other write states in a multiple-state memory system. Nevertheless, the invention is not intended to limit the type of resistive the memory system 100.

Considering accuracy of detecting whether the selected resistive memory cells switch to the second resistive state, the memory controller 120 may determine whether a number of the selected resistive memory cells which switch to the second resistance state is larger than a threshold number to generate a determining result, and then may provide a control signal to disable the strong write time period according to the determining result.

In detail, when the number of the selected resistive memory cells which switch to the second state is larger than the threshold number, the memory controller 120 may not execute the strong write operation on the resistive memory system 100, and may switch to enable a write time period for executing the regular write operation on the resistive memory system 100. In other words, when the number of the selected resistive memory cells which switch to the second state is enough, the memory controller 120 may determine that the board mount operation is applied on the resistive memory system 100 accordingly. As such, the resistive memory system 100 may be controlled to switch to the regular write operation by enabling the write time period.

In the present embodiment, the strong write operation or the regular write operation may be automatically selected during a predetermined period by detecting an indicator signal which indicates a board mount thermal cycle has been experienced. For example, the strong write operation or the regular write operation may be automatically selected during a power-up period by detecting on-chip IR-reflow indicator bit(s) or an on-chip IR-reflow thermal sensor if a board mount thermal cycle(s) has been experienced. If the resistive memory system 100 detects a board mount thermal cycle has been conducted, the resistive memory system 100 operates with the regular write operation when receiving a write command. If the resistive memory system 100 detects a board mount thermal cycle has not been conducted, the resistive memory system 100 operates with a strong write operation when receiving the write command.

In the present embodiment, the resistive memory system 100 may be implemented as a chip including an additional external pad. The strong write operation may also be determined or distinguished by a status, e.g. a high voltage, of the additional external pad in this case. For example, the strong write operation is conducted when the resistive memory system 100 receives a write command together with the additional external pad at a high voltage state, e.g. 9V. Alternatively, the regular write operation is conducted when the resistive memory system 100 receives the write command with the additional external pad at a regular high state or a regular low state, e.g. at 3V or 0V respectively.

In the present embodiment, the memory controller 120 executes the strong write operation in response to a strong write command, and executes the regular write operation in response to a regular write command, where the strong write command is different from the regular write command. The difference between the strong write command and the regular write command is at least a write algorithm. There are several exemplary embodiments of the strong write operation and the regular write operation provided as follows.

Figure 4:
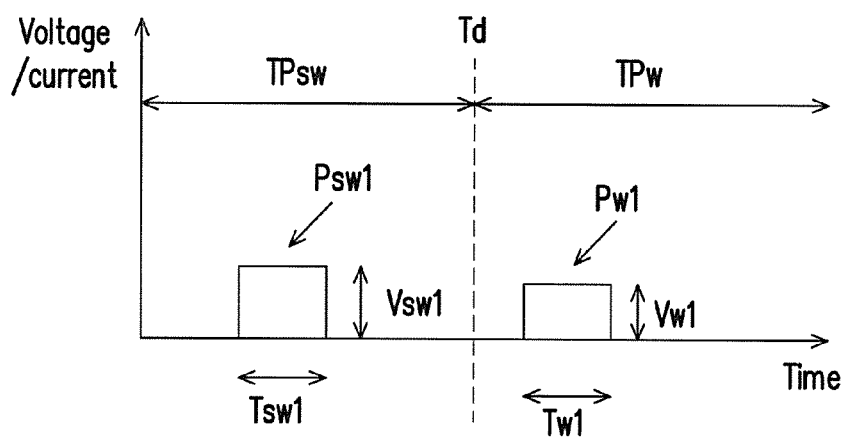
FIG. 4 illustrates a schematic diagram of the strong write operation and the regular write operation according to an embodiment of invention.

In an exemplary embodiment, the different write algorithms of the strong write operation and the regular write operation include different write voltage levels for different write states. For example, the strong write operation may be executed by applying a first voltage, and the regular write operation may be executed by applying a second voltage, where the first voltage is greater than the second voltage. Referring to FIG. 4, FIG. 4 illustrates a schematic diagram of the strong write operation and the regular write operation according to an embodiment of invention. In the present embodiment, the write algorithm of the strong write operation may be different from the write algorithm of the regular write operation due to different write voltage levels for the SET pulse and/or the RESET pulse. During a strong write time period TPsw, the memory controller 120 may execute the strong write operation Psw1 by applying a strong write voltage Vsw1 (corresponding to the first voltage). The strong write operation Psw1 may be a voltage pulse with a pulse width Tsw1. On the other hand, the memory controller 120 may execute the regular write operation Pw1 by applying a regular write voltage Vw1 (corresponding to the second voltage) during the regular write time period TPw. The regular write operation Pw1 may be a voltage pulse with a pulse width Tw1. As shown in FIG. 4, the strong write voltage Vsw1 may be greater than the write voltage Vw1, and the pulse width Tsw1 and Tw1 may be the same. In an exemplary embodiment, when the board mount operation is executed (at a time point Td, for example), the memory controller 120 may disable the strong write time period TPsw, and may switch to enable the regular write time period TPw.

In another exemplary embodiment, different write algorithms of the strong write operation and the regular write operation include different write compliance current limits for different write states. For example, the strong write operation may be executed by applying a first current, and the regular write operation may be executed by applying a second current, where the first current may be greater than the second current. Taking the embodiment of FIG. 4 as example again, the write algorithm of the strong write operation may be different from the write algorithm of the regular write operation due to different write compliance current limits for the SET pulse and/or the RESET pulse in the present embodiment. The first current may be regarded as a limiting current for the strong write operation Psw1, and the second current may be regarded as a limiting current for the regular write operation Pw1. The waveforms of the current in the embodiment may be similar to the embodiment of FIG. 4, and therefore descriptions is omitted here.

Figure 5:
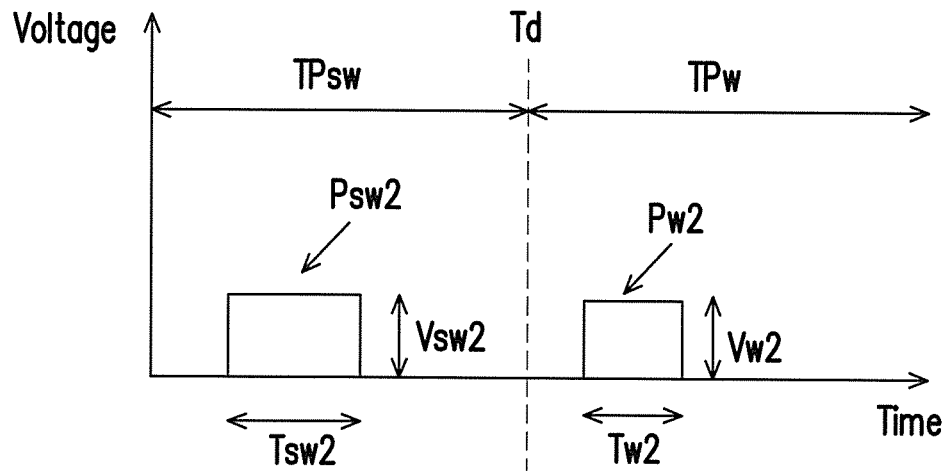
FIG. 5 illustrates a schematic diagram of the strong write operation and the regular write operation according to another embodiment of invention.

In another exemplary embodiment, different write algorithms of the strong write operation and the regular write operation include different write pulse widths for different write states. For example, a first voltage pulse with a first pulse width may be provided for executing the strong write operation, and a second voltage pulse with a second pulse width may be provided for executing the regular write operation, where the first pulse width may be longer than the second pulse width. Referring to FIG. 5, FIG. 5 illustrates a schematic diagram of the strong write operation and the regular write operation according to another embodiment of invention. In the present embodiment, the write algorithm of the strong write operation may be different from the write algorithm of the regular write operation due to different write pulse widths for the SET pulse and/or the RESET pulse. During the strong write time period TPsw, the memory controller 120 may execute a strong write operation Psw2 by providing a first voltage pulse with a strong write voltage Vsw2 and a pulse width Tsw2 (corresponding to the first pulse width). On the other hand, the memory controller 120 may execute a regular write operation Pw2 by providing a second voltage pulse with a regular write voltage Vw2 and a pulse width Tw2 (corresponding to the second pulse width) during the regular write time period TPw. As shown in FIG. 5, the pulse width Tsw2 may be longer than the pulse width Tw2, and the strong write voltage Vsw2 and the regular write voltage Vw2 may be the same. In addition, when the board mount operation is executed (at a time point Td, for example), the memory controller 120 may disable the strong write time period TPsw, and may switch to enable the regular write time period TPw.

Figure 6:
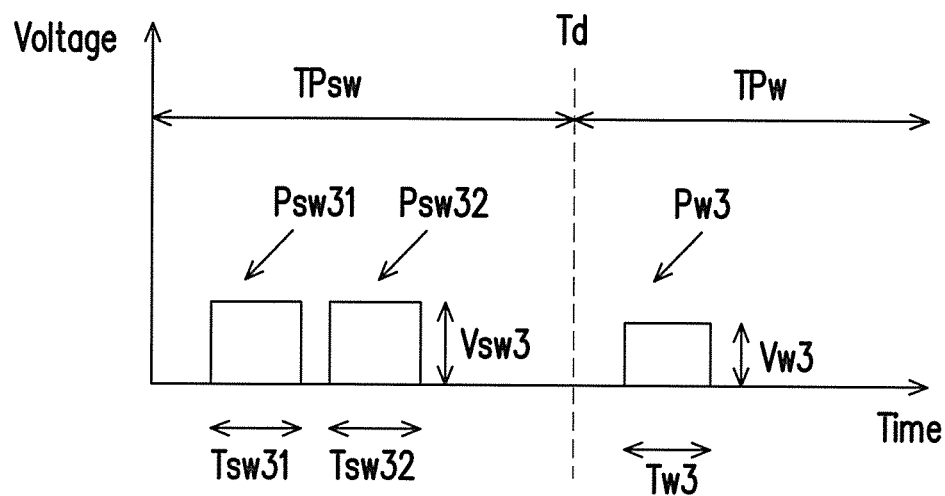
FIG. 6 illustrates a schematic diagram of the strong write operation and the regular write operation according to another embodiment of invention.

In another exemplary embodiment, different write algorithms of the strong write operation and the regular write operation include different number of multiple write pulses for different write states. For example, at least one first voltage pulse may be provided for executing the strong write operation, and at least one second voltage pulse may be provided for executing the regular write operation, where a number of the at least one first voltage pulse may be greater than a number of the at least one second voltage pulse. Referring to FIG. 6, FIG. 6 illustrates a schematic diagram of the strong write operation and the regular write operation according to another embodiment of invention. In the present embodiment, the write algorithm of the strong write operation may be different from the write algorithm of the regular write operation due to different number of multiple write pulses for the SET pulse and/or the RESET pulse. During the strong write time period TPsw, the memory controller 120 may execute a strong write operation including two voltage pulses Psw31 and Psw32 (corresponding to the at least one first voltage pulse). The voltage pulses Psw31 and Psw32 may be with an identical strong write voltage Vsw3, and the voltage pulses Psw31 and Psw32 may have pulse widths Tsw31 and Tsw32, respectively. On the other hand, the memory controller 120 may execute a regular write operation including a voltage pulse Pw3 (corresponding to the at least one second voltage pulse) with a write voltage Vw3 and a pulse width Tw3 during the write time period TPw. It is noted that, the aforementioned number of voltage pulses included in the strong write operation is merely an exemplary number, and the invention is not intended to limit thereto.

In another exemplary embodiment, a plurality of first voltage pulses may be provided for executing the strong write operation according to a first algorithm, and a plurality of second voltage pulses may be provided for executing the regular write operation according to a second algorithm, where the first algorithm may be different from the second algorithm. The aforementioned first and second algorithms may be deduced by analogy according to the exemplary embodiments depicted in FIG. 4 to FIG. 6, and therefore descriptions is omitted here.

In another exemplary embodiment, different write algorithms of the strong write operation and the regular write operation include different verify margins for different write states. As illustrated in FIG. 3, the write algorithm of the strong write operation may be different from the write algorithm of the regular write operation due to different verify margin for the SET pulse and/or the RESET pulse in the present embodiment. For example, the read margin MR2 provided by the strong write operation is larger than the read margin MR1 provided by the regular write operation.

Figure 7:
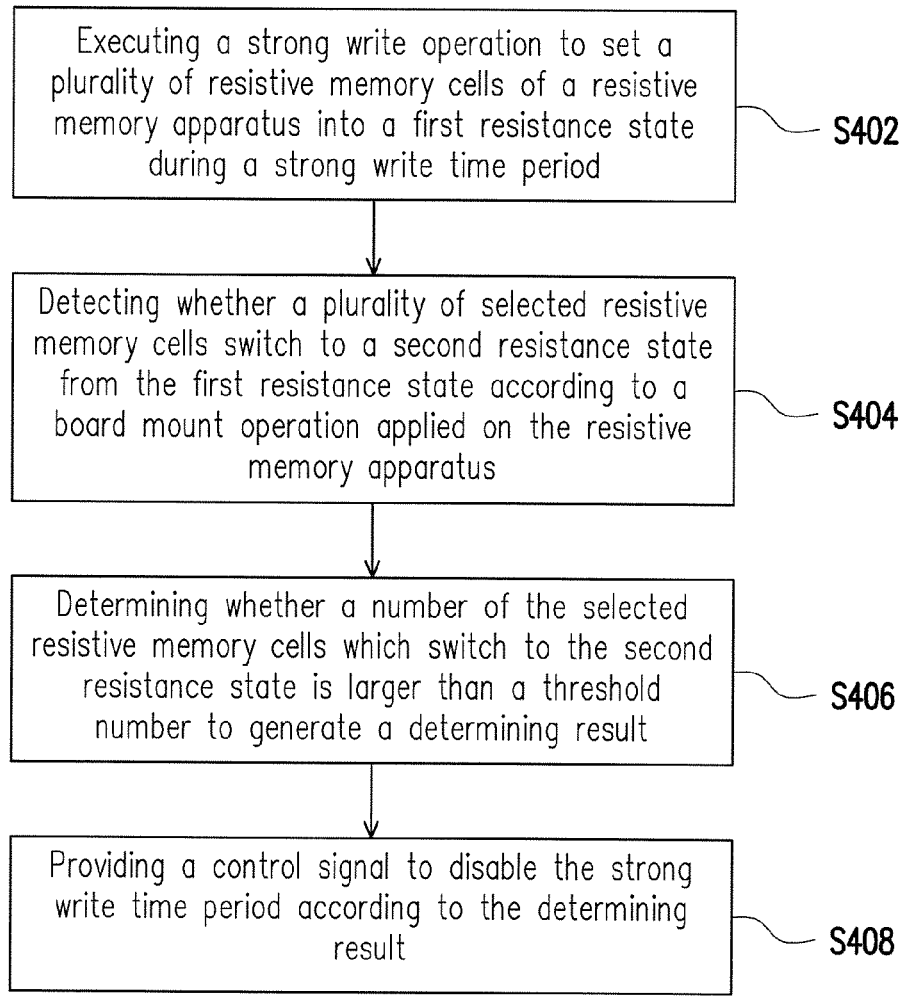
FIG. 7 illustrates a flow chart of an operating method of a resistive memory system according to an embodiment of invention.

Form another perspective, an operating method of a resistive memory system is provided. Referring to FIG. 7, FIG. 7 illustrates a flow chart of an operating method of a resistive memory system according to an embodiment of invention. In step S402, a strong write operation is executed to set a plurality of resistive memory cells of the resistive memory system into a first resistance state during a strong write time period. In step S404, whether a plurality of selected resistive memory cells switch to a second resistance state from the first resistance state according to a board mount operation executed on the resistive memory system is detected. In step S406, whether a number of the selected resistive memory cells which switch to the second resistance state is larger than a threshold number is determined to generate a determining result. In step S408, a control signal is provided to disable the strong write time period according to the determining result.

The details of the steps S402, S404, S406 and S408 have been described in the embodiments mentioned above, and no more description repeated here.

Figure 8:
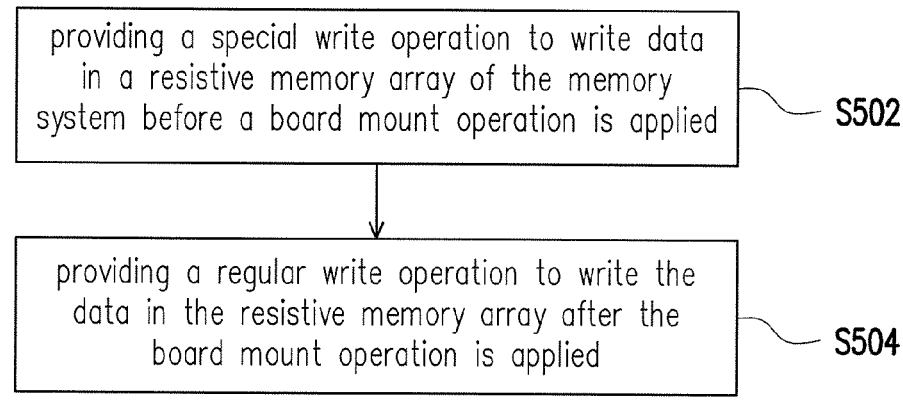
FIG. 8 illustrates a flow chart of an operating method of a resistive memory system according to another embodiment of invention.

Referring to FIG. 8, FIG. 8 illustrates a flow chart of an operating method of a resistive memory system according to another embodiment of invention. Referring to FIG. 1, FIG. 2, and FIG. 8, the operating method of the resistive memory system of the present embodiment is at least adapted to the resistive memory system 100 of FIG. 1 and the resistive memory array 200 of FIG. 2, but the invention is not limited thereto. Taking the resistive memory system 100 of FIG. 1 and the resistive memory array 200 of FIG. 2 for example, in step S502, the memory controller 120 provides a special write operation to write the data in the resistive memory array 200 before a board mount operation is applied. In step S504, the memory controller 120 provides a regular write operation to write the data in the resistive memory array 200 after a board mount operation is applied. In the present embodiment, the read margin provided by the special write operation is larger than the read margin provided by the regular write operation.

In addition, the operating method of the resistive memory system described in this embodiment of the invention is sufficiently taught, suggested, and embodied in the embodiments illustrated in FIG. 1 to FIG. 7, and therefore no further description is provided herein.

It is worthy mentioning that, the aforementioned operating method may be adaptively applied in other emerging technologies, such as phase change random write memory (PCRAM), or conductive-bridging random write memory (CBRAM), etc.

In summary, the embodiments of the invention provides a memory system and an operating method thereof, which may effectively determine whether the memory system is applied by the board mount operation based on the selected memory cells which to be strong-written. Moreover, the data retention requirement, particularly under the high temperature, may be achieved based on the strong write operation executed before the board mount operation.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A memory system, comprising:
a non-volatile memory array, configured to store data; and
a memory controller, coupled to the non-volatile memory array, and configured to:
provide a special write operation to write the data in the non-volatile memory array before a board mount operation is applied, and
provide a regular write operation to write the data in the non-volatile memory array after the board mount operation is applied,
wherein a read margin provided by the special write operation is larger than a read margin provided by the regular write operation, and a first power provided by the special write operation is greater than a second power provided by the regular write operation.

2. The memory system according to claim 1, wherein the non-volatile memory array comprises a phase change random write memory (PCRAM), or a resistive random write memory (RRAM), or conductive-bridging random write memory (CBRAM).

3. The memory system according to claim 1, wherein the special write operation is limited to a narrower temperature range and/or a narrower supply voltage range than a temperature range and/or a supply voltage range that the regular write operation is limited.

4. The memory system according to claim 1, wherein the memory controller is further configured to detect a number of selected memory cells of the non-volatile memory array being provided with the special write operation that switch to a second resistance state from the first resistance state before providing the regular write operation, and when the number of selected memory cells which switch to the second resistance state is greater than a threshold number, the memory controller disables the special write operation and switches to provide the regular write operation.

5. The memory system according to claim 1, wherein the special write operation or the regular write operation are automatically selected during a predetermined period by detecting an indicator signal which indicates a board mount thermal cycle has been experienced.

6. The memory system according to claim 1, wherein the special write operation is determined by a status of an external pad of the memory system.

7. The memory system according to claim 1, wherein the non-volatile memory array includes at least one of a memory data array, an error-correcting code (ECC) array, and a redundancy array, and the special write operation is applied to the memory data array, the error-correcting code (ECC) may, or the redundancy array.

8. The memory system according to claim 1, wherein the memory controller executes the special write operation in response to a special write command, and executes the regular write operation in response to a regular write command, wherein the special write command is different from the regular write command.

9. The memory system according to claim 8, wherein a write algorithm of the special write command is different from a write algorithm of the regular write command.

10. The memory system according to claim 9, wherein different write algorithms of the special write operation and the regular write operation comprise different write voltage levels for different write states, different write compliance current limits for different write states, different write pulse widths for different write states, different number of multiple write pulses for different write states, or different verify margins for different write states.

11. An operating method of a memory system, comprising:
providing a special write operation to write data in a non-volatile memory array of the memory system before a board mount operation is applied; and
providing a regular write operation to write the data in the non-volatile memory array after the board mount operation is applied,
wherein a read margin provided by the special write operation is larger than a read margin provided by the regular write operation, and a first power provided by the special write operation is greater than a second power provided by the regular write operation.

12. The operating method of the memory system according to claim 11, wherein the non-volatile memory array comprises a phase change random write memory (PCRAM), or a resistive random write memory (RRAM), or conductive-bridging random write memory (CBRAM).

13. The operating method of the memory system according to claim 11, wherein the special write operation is limited to a narrower temperature range and/or a narrower supply voltage range than a temperature range and/or a supply voltage range that the regular write operation is limited.

14. The operating method of the memory system according to claim 11, further comprising:
detecting a number of selected memory cells of the non-volatile memory array being provided with the special write operation that switch to a second resistance state from the first resistance state before providing the regular write operation; and
disabling the special write operation and switching to provide the regular write operation when the number of selected memory cells which switch to the second resistance state is greater than a threshold number.

15. The operating method of the memory system according to claim 11, further comprises:
automatically selecting the special write operation or the regular write operation during a predetermined period by detecting an indicator signal which indicates a board mount thermal cycle has been experienced.

16. The operating method of the memory system according to claim 11, wherein the special write operation is determined by a status of an external pad of the memory system.

17. The operating method of the memory system according to claim 11, wherein the non-volatile memory array includes at least one of a memory data array, an error-correcting code (ECC) array, and a redundancy array, and the special write operation is applied to the memory data array, the error-correcting code (ECC) array, or the redundancy array.

18. The operating method of the memory system according to claim 11, wherein the special write operation is executed in response to a special write command, and the regular write operation is executed in response to a regular write command, wherein the special write command is different from the regular write command.

19. The operating method of the memory system according to claim 18, wherein a write algorithm of the special write command is different from a write algorithm of the regular write command.

20. The operating method of the memory system according to claim 19, wherein different write algorithms of the special write operation and the regular write operation comprise different write voltage levels for different write states, different write compliance current limits, different write pulse widths for different write states, different number of multiple write pulses for different write states, or different verify margins for different write states.

* * * * *

UNITED STATES PATENT AND TRADEMARK OFFICE
CERTIFICATE OF CORRECTION

| | | |
|---|---|---|
| PATENT NO. | : 9,798,481 B1 | Page 1 of 1 |
| APPLICATION NO. | : 15/182612 | |
| DATED | : October 24, 2017 | |
| INVENTOR(S) | : Ming-Huei Shieh et al. | |

It is certified that error appears in the above-identified patent and that said Letters Patent is hereby corrected as shown below:

On the Title Page

(54) should read:
MEMORY SYSTEM INCLUDES A MEMORY CONTROLLER COUPLED TO A NON-VOLATILE MEMORY ARRAY CONFIGURED TO PROVIDE SPECIAL WRITE OPERATION TO WRITE DATA IN THE NON-VOLATILE MEMORY ARRAY BEFORE A BOARD MOUNT OPERATION IS APPLIED AND PROVIDE A REGULAR WRITE OPERATION AFTER A BOARD MOUNT OPERATION IS APPLIED Signed and Sealed this
Twenty-second Day of May, 2018

Andrei Iancu
*Director of the United States Patent and Trademark Office*